(12) United States Patent
Kamath et al.

(10) Patent No.: US 7,719,369 B2
(45) Date of Patent: May 18, 2010

(54) SIGMA DELTA DIGITAL TO ANALOG CONVERTER WITH WIDE OUTPUT RANGE AND IMPROVED LINEARITY

(75) Inventors: Anant Shankar Kamath, Bangalore (IN); Biman Chattopadhyay, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 58 days.

(21) Appl. No.: 12/211,834

(22) Filed: Sep. 17, 2008

(65) Prior Publication Data

US 2010/0066455 A1 Mar. 18, 2010

(51) Int. Cl.
*H03L 7/099* (2006.01)
*H03M 1/66* (2006.01)
*H03M 1/68* (2006.01)

(52) U.S. Cl. .................. 331/34; 331/36 C; 331/36 L; 341/145

(58) Field of Classification Search .................. 331/1 A, 331/8, 16–18, 25, 34, 36 R, 36 C, 36 L; 341/144, 341/145
See application file for complete search history.

(56) References Cited

U.S. PATENT DOCUMENTS 6,037,888 A * 3/2000 Nairn .......................... 341/145

\* cited by examiner

*Primary Examiner*—David Mis
(74) *Attorney, Agent, or Firm*—Ronald O. Neerings; Wade James Brady, III; Frederick J. Telecky, Jr.

(57) ABSTRACT

A sigma delta DAC using a single DAC to generate a first analog quantity portion and a second analog quantity portion, having a strength respectively proportionate to the most significant bits (MSBs) and least significant bits (LSBs) of a received digital value. The two portions are added to generate an analog output representing the strength of the digital value. In an embodiment, the single DAC contains a set of current sources, with some of the current sources (determined by the value of the MSBs) being connected to provide the corresponding output currents on a first path. Some of the other current sources, determined by a value of the LSBs, are controlled to be connected to provide the corresponding output currents on a second path. The time durations the currents are connected to the second path, are determined by the output of a sigma delta modulator.

20 Claims, 7 Drawing Sheets

| | 601 | 602 | 603 |
|---|---|---|---|
| 611 | L.49999 | L-1 | 1.49999 |
| 612 | L.5 | L | 0.5 |
| 613 | L.50001 | L | 0.50001 |
| 614 | L.9 | L | 0.9 |
| 615 | L+1.0 | L | 1.0 |
| 616 | L+1.1 | L | 1.1 |
| 617 | L+1.49999 | L | 1.49999 |
| 618 | L+1.5 | L+1 | 0.5 |

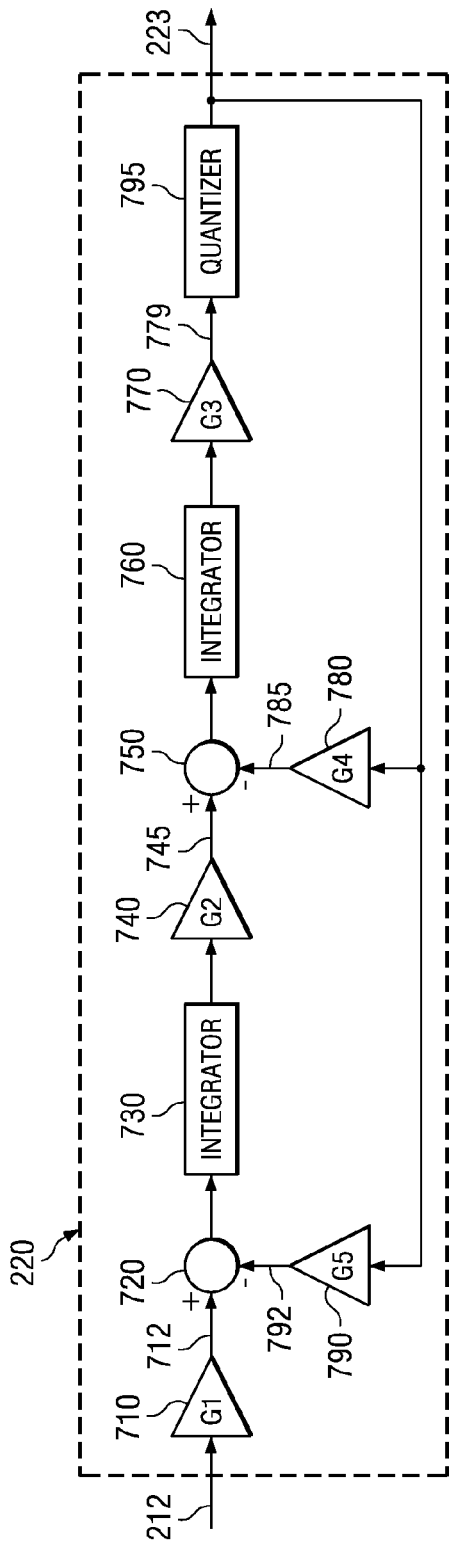

SIGMA DELTA DIGITAL TO ANALOG CONVERTER WITH WIDE OUTPUT RANGE AND IMPROVED LINEARITY

BACKGROUND

1. Field of the Invention

The present invention relates generally to digital to analog converters, and more specifically to a sigma delta digital to analog converter (SD-DAC) with wide output range and improved linearity.

2. Related Art

Digital to analog converters (DAC) are often implemented employing sigma delta (also known as delta sigma) modulation techniques. As is well known in the relevant arts, a sigma delta DAC is a type of DAC containing a sigma delta modulator followed by a digital-to-analog conversion stage and an analog filter, with the sigma delta modulator receiving the digital input (or at least a portion of the digital input) sought to be converted, and the analog filter providing the corresponding analog level.

As is also well known in the relevant arts, a first order sigma delta modulator may contain one summing junction, an integrator and a quantizer. The output of the quantizer (which is also the output of the sigma delta modulator) is subtracted from the input, and the resulting difference (delta value) is integrated. The integrated value (sigma value) is then quantized (converted to a nearest one of multiple predetermined discrete levels) by the quantizer. Higher order sigma delta modulators may contain further summing junctions and quantizers, as is also well known in relevant arts. Different architectures of sigma delta modulators are used to achieve different goals such as lower power, ease of implementation, etc.

Output range of a sigma delta DAC refers to the range of analog levels (e.g., −5 volts to +5 volts) that can be provided by the sigma delta DAC. Linearity, generally, is a measure of the extent of straight-line relation between the inputs and the corresponding outputs.

Several aspects of the present invention provide a sigma delta DAC with wide output range and/or improved linearity.

SUMMARY

A sigma delta digital to analog converter (DAC) provided according to an aspect of the present invention uses a single DAC to generate a first analog quantity (current, voltage, impedance, transconductance, etc.) and a second analog quantity, having a strength respectively proportionate to the most significant bits (MSBs) and least significant bits (LSBs) of a received digital value. The two portions are added to generate an analog output representing the strength of the digital value.

In an embodiment, the single DAC contains a set of (one or more) current sources, with some of the current sources (determined by the value of the MSBs) being connected to provide the corresponding output currents on a first path. Some of the other current sources, determined by a value of the LSBs of the received digital value, are controlled to be connected to provide the corresponding output currents on a second path. The time durations the currents are connected to the second path, are determined by the output of a sigma delta modulator.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

BRIEF DESCRIPTION OF THE DRAWINGS

The present invention will be described with reference to the following accompanying drawings, which are described briefly below.

FIG. 7 is a block diagram of a sigma delta modulator in an embodiment of the present invention.

FIGS. 8A and 8B illustrate percentage durations of each possible output levels of a quantizer used in a SD modulator for a specific transition in the input value in an embodiment of the present invention.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

Various features of the present invention will be clear in comparison with a prior approach. Accordingly, the description of such a prior approach is provided first.

1. Prior Sigma Delta DAC

Figure 1:
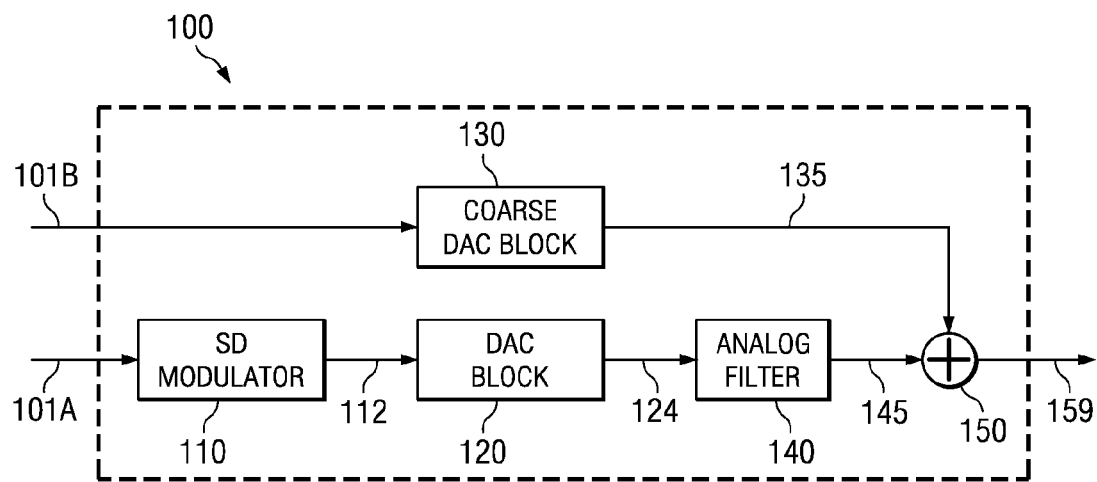
FIG. 1 is a block diagram illustrating the details of a prior sigma delta DAC providing a wide output range.

FIG. 1 is a block diagram illustrating the details of a prior sigma delta DAC providing a wide output range. Sigma delta DAC 100 is shown containing sigma delta (SD) modulator 110, DAC block 120, coarse DAC block 130, analog filter 140 and summing block 150.

Digital codes/values required to be converted to analog form are received on input path 101, shown split into paths 101A and 101B. A predetermined number of lower significant bits (LSB) of each digital code is provided on path 101A, while the remaining more significant bits (MSB) of the code is provided on path 101B. Assuming each input digital code (path 101) is N-bits wide, the LSBs (X−1) through 0 may be provided on path 101A, while MSBs (N−1) through X are provide on path 101B.

Coarse DAC block 130 receives, on path 101B, MSBs (N−1) through X of each N-bit input digital code, and provides a corresponding analog quantity (in the form of voltage, current, capacitance, inductance, impedance, trans-conductance, frequency, delay, etc.) on path 135. SD modulator 110 receives on path 101A, LSBs (X−1) through 0 of each N-bit input digital code, and provides a corresponding digital value (single or multi-bit-quantized output, depending on the quantizer contained internally) on path 112. As is well known in the relevant arts, the average value of the digital values provided on path 112 is representative of input 101A.

DAC block 120 receives the digital values output by SD modulator on path 112, and provides corresponding analog values (in the form of voltage or current) on path 124. Analog filter 140 performs low-pass filtering on the analog values on path 124. The filtered analog values are provided on path 145. Summing block 150 adds the analog values on paths 135 and 145, to provide a final analog value on path 159 representing the digital input received on path 101. Although shown as operating on the output of analog filter 140, summing block 150 may instead be place ahead of analog filter 140 (to sum outputs 135 and 124), and then provide a combined/summed value to analog filter 140, which then provides filtered values directly on path 159.

In the prior approach described above, coarse DAC block 130 operates to provide coarse output analog values (coarse resolution/ranges), with the combination of SD modulator 110, DAC block 120 and analog filter 140 operating to provide finer analog values (fine resolution) within any two successive coarse values. As a result, the overall output range of the analog output on path 159 is increased. DAC block 120 may be implemented to have a relatively smaller step size, thereby resulting in better noise performance, lower OSR (oversampling ratio), fewer internal elements, etc.

However, mismatch (deviations from desired values, caused, for example, by random or systematic variations during manufacture) between internal elements used within coarse DAC block 130 and DAC block 120 may degrade the linearity (DNL—differential non linearity) of output 159 with respect to input 101 of sigma delta DAC 100. Specifically, whenever an element (e.g., current source) within coarse DAC block 130 is turned on or off (corresponding to input 101 crossing a "coarse level", which is every X bits) an error may be introduced in the output. Matching of DAC elements (in coarse DAC block 130 and DAC block 120) may be difficult to achieve in several scenarios, for example, such as UDSM (ultra deep submicron) CMOS technologies.

Several aspects of the present invention overcome some of the problems noted above, as described next with respect to example embodiments.

2. Sigma Delta DAC Providing Improved Linearity

Figure 2:
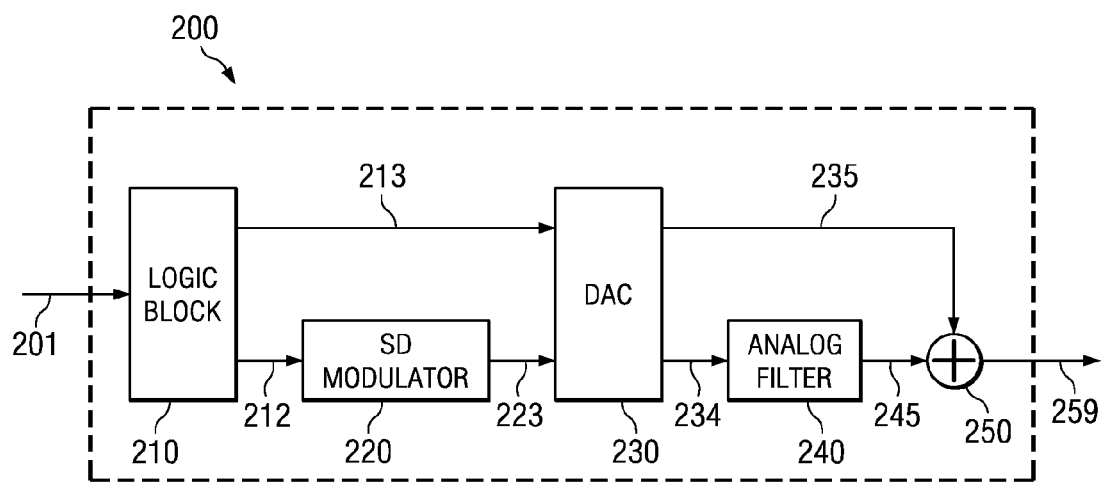
FIG. 2 is a block diagram of a sigma delta DAC in an embodiment of the present invention.

FIG. 2 is a block diagram of a sigma delta DAC in an embodiment of the present invention. Sigma delta DAC 200 is shown containing logic block 210, SD modulator 220, DAC 230, analog filter 240, and summing block 250.

Logic block 210 (also termed control logic, in general) receives an N-bit digital code as input on path 201, and forwards an MSB (most significant bits) portion to DAC 230 on path 213, and a LSB (lesser significant bits) portion on path 212 to SD modulator 220. In an embodiment described in detail below, the inputs provided by logic block 210 to DAC 230 are in thermometric form (one bit corresponding to each possible value). Logic block 210 forwards the LSBs either directly, or a value formed from the LSBs by a corresponding operation, to SD modulator 220 on path 212.

An N-bit input digital code (201) may be viewed as containing an integer (or coarse) portion represented by the MSBs, and a fractional (or fine) portion represented by the LSBs. Thus, each N-bit input digital code may be represented by a real number L.P, with L denoting the decimal value of the MSBs, and the fraction 0.P representing the decimal value of the LSBs. Accordingly, in the description below, 'L' is also referred to as (determining) the coarse portion of the final analog output (259), and "0.P" as (determining) the "fine" portion of the final analog output (259).

SD modulator 220 provides on path 223, quantized values (single or multi-bit values) corresponding to the values received on path 212. The quantized values represent the result of sigma delta modulation on the inputs received on path 212. Sigma delta modulation operation is not described here as being well known in the relevant arts, and only a brief illustration of an example sigma delta modulator is provided in sections below.

DAC 230 converts digital values received as inputs on paths 213 and 212 into respective analog quantity (voltage, current, capacitance, inductance, impedance, trans-conductance, frequency, delay, etc.), which are provided on paths 234 (fine output) and 235 (coarse output). The magnitude of the analog quantity represents the magnitude the digital value.

It may be appreciated that in contrast to the prior approach of FIG. 1, a single DAC is used to convert both the MSBs (or values formed from the MSBs) as well as the LSBs (or values formed from the LSBs). Thus, a same (single) set of internal components (DAC elements) of DAC 230 is used to provide both "coarse" as well as "fine" resolution. Such an approach overcomes the mismatch problem noted above with respect to the prior approach, and as further illustrated below with respect to an example embodiment of the present invention.

More particularly, DAC 230 contains at least one "common" DAC element (e.g., a current source) which is operable by each of inputs 223 and 213, in sharp contrast to the prior approach of FIG. 1. The analog output provided by DAC 230 on path 235 is combined (added) with the filtered analog value on path 245, and a summed analog value corresponding to digital input 201 is provided on path 259. It is noted that the implementation of analog filter 240 may be optional, and several aspects of the present invention may be applied even without the use of analog filter 240. Further, paths 234 and 235 may be combined before the filtering operation by analog filter 240, although this may require the filter to handle a higher range of signals.

DAC 230 may be implemented using any one of several well-known approaches. An example implementation is described in detail next.

3. DAC

Figure 3:
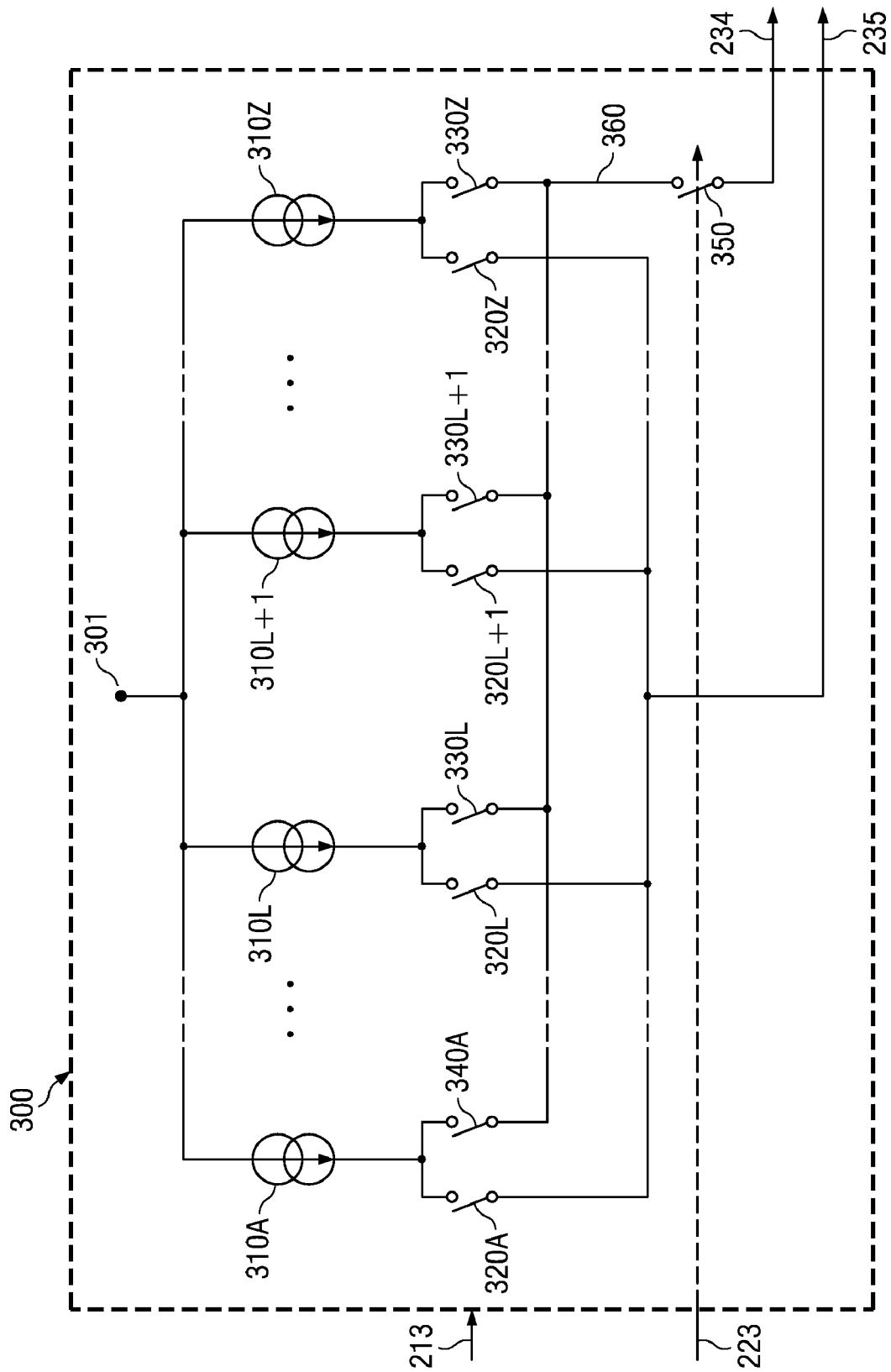
FIG. 3 is a diagram illustrating the internal details of a DAC block in an embodiment of the present invention.

FIG. 3 is a diagram illustrating the internal details of a DAC in an embodiment of the present invention. DAC 300, implemented as a thermometric current DAC in the example, is shown containing constant current sources 310A through 310Z, and switches 320A-320Z, 330A-330Z and 350. SD modulator 220 (FIG. 2) when used in combination with DAC 300 (used in place of DAC 230 of FIG. 2) is implemented with a two-level quantizer, and provides a bit stream with each bit in the bit stream having a logic value of either 0 or 1. In an embodiment, the output of the quantizer is a logic 1 if the input to the quantizer is greater than half the output range of SD modulator 220, and a logic 0 if the input to the quantizer is less than or equal to half the output range of SD modulator 220. The input range of SD modulator 220 is assumed input ranges from 0.000 to 0.99999. Each of current sources 310A-310Z provides a current of strength "I" amperes.

DAC 300, built as a thermometric DAC, is shown containing two sets of switches, a first set formed by switches 320A-320Z, and a second set formed by switches 330A-330Z and 350. The MSBs of input digital code (201) (corresponding to the integer portion 'L' noted above), are received on path 213 in thermometric format, and control the closing or opening of switches 320A-320Z (also referred to as "coarse switches" below), thereby either connecting or disconnecting the corresponding current sources to (from) path 235.

The two-level bit stream provided by SD modulator 220 (FIG. 2) on path 223, controls the closing and opening of switch 350 (as denoted by the dotted line in FIG. 3) depending on the specific value of each bit in the bit stream. The rate at which the two-level bit stream is provided on path 223 may be the same as the sampling rate (OSR, over-sampling rate) of SD modulator 220. The average value of the bit stream on path 223 represents the fractional part "0.P" noted above. For each input digital code (201), logic block 210 closes one of switches 330A-330Z, depending on the specific value of the received input digital code (201). The set of switches 330A-330Z and 350 is also referred to below as "fine switches".

The total number of current sources (310A-310Z) equals the total output range of DAC 300. To illustrate, assuming digital code 201 has the lowest possible value (for example, all N bits equal to logic zero), none of the current sources would be connected to paths 235 or 234. When digital code 201 has the highest value (e.g., all N bits equal to logic one), all the current sources would be connected to path 235. When digital code 201 has a value (representable as L.P, as noted above) between the maximum and minimum value, L 'coarse' switches (e.g., 320A through 320L) are closed to connect the corresponding L current sources (310A through 310L) to common path 235, with the rest of switches 320L+1 to 320Z being open.

The $(L+1)^{th}$ 'fine' switch (330L+1) is closed to connect the $(L+1)^{th}$ current source (310L+1) to path 360, with the rest of switches in the set 330A-330Z being open. The current of the $(L+1)^{th}$ current source (310L+1) is switched on and off by bit stream 223.

Thus, the total current on path 235 equals (L*I), and the average value of current (plus quantization noise) on path 234 equals (I*0.P). Current on path 234 is filtered by analog filter 240 (and provided on path 245) to remove the quantization noise, and the sum of the currents on paths 245 and 235 provides a current output with a strength corresponding to the input digital code 201.

With respect to the illustration above, logic block 210 (FIG. 2) provides output bits on path 213 to close L coarse switches, and the $(L+1)^{th}$ fine switch. The LSBs provided by logic block 210 to SD modulator 220 on path 212 represent the fractional portion 0.P. The resolution of current on path 234 (representing 0.P) is based on the specific implementation of SD modulator 220. In an embodiment, SD modulator 220 is implemented to provide a resolution to enable representation of 0.P up to five decimal places, i.e., fractional values 0.0 through 0.99999.

As the N-bit input code L.P increases from L.0 to L+0.99999, output 223 of SD modulator 220 operates to maintain switch 350 in the 'on' state more often than the 'off' state, thereby increasing the average contribution of the $(L+1)^{th}$ current source (310L+1). When L.P has a value very close to L+0.99999, the average contribution of the $(L+1)^{th}$ current source approaches 100%.

When L.P equals L+1.0, logic block 210 opens the $(L+1)^{th}$ fine switch (330L+1) (which was previously closed), and closes the $(L+1)^{th}$ coarse switch (320L+1). Logic block 210 also closes the $(L+2)^{th}$ fine switch (not shown), thereby connecting the $(L+2)^{th}$ current source (not shown) to path 360. For L.P just exceeding L+1.0 (e.g., L.P=L+1.00001), output 223 of SD modulator is such that the average contribution of the $(L+2)^{th}$ current source is slightly greater than zero.

Therefore, when digital code 201 transitions from slightly less than (L+1.0) to slightly greater than (L+1.0) the total output current (path 259 in FIG. 2) does not experience a discontinuity. The $(L+1)^{th}$ current source has contribution close to 100% before it is permanently turned on (and added to path coarse output 235), and the (L+2)th current sources contributes close to zero when it is added to fine output 234.

It may be appreciated from the description above that the technique of FIG. 3 overcomes the problem of matching noted with respect to the prior approach. That is, there is no discontinuity when the output transitions from slightly less than L+1.0 to slightly more than L+1.0, even if/when the current sources 310L, 310L+1 and 310L+2 are not equal to one another. As a result, sigma delta DAC 200 (FIG. 2) implemented using DAC 300 of FIG. 3 provides a high level of linearity (reduced DNL), as well as a wide range.

It is noted that although output 223 of SD modulator 220 is shown as controlling switch 350 in the embodiment of FIG. 3, in other embodiments output 223 may be provided to directly control the corresponding one of switches 330A-330Z, such as switch (330L+1) in the illustration above.

The technique described above may, however, suffer from the adverse effects of overloading of SD modulator 220. As is well-known in the relevant arts, a SD modulator does not perform well when its input causes it to operate close to the extremes of its dynamic range. In such cases, the SD modulator output can get stuck at either level (logic zero or logic 1 in the 2-level output described above), a phenomenon generally termed sigma delta overloading. As a result, when operated at such values of digital input 201 a wrong average may be obtained on fine output 234. For the circuit of FIG. 3, such errors may occur when input L.P is close to L.0 or L.99999 (SD modulator 220 operates at the extremes of its range (P approaches 0 or P approaches 0.99999).

An approach according to the present invention overcomes the problem noted above with respect to FIG. 3, and is described next.

4. DAC Scheme Designed to Prevent SD Modulator Overloading

Figure 4:
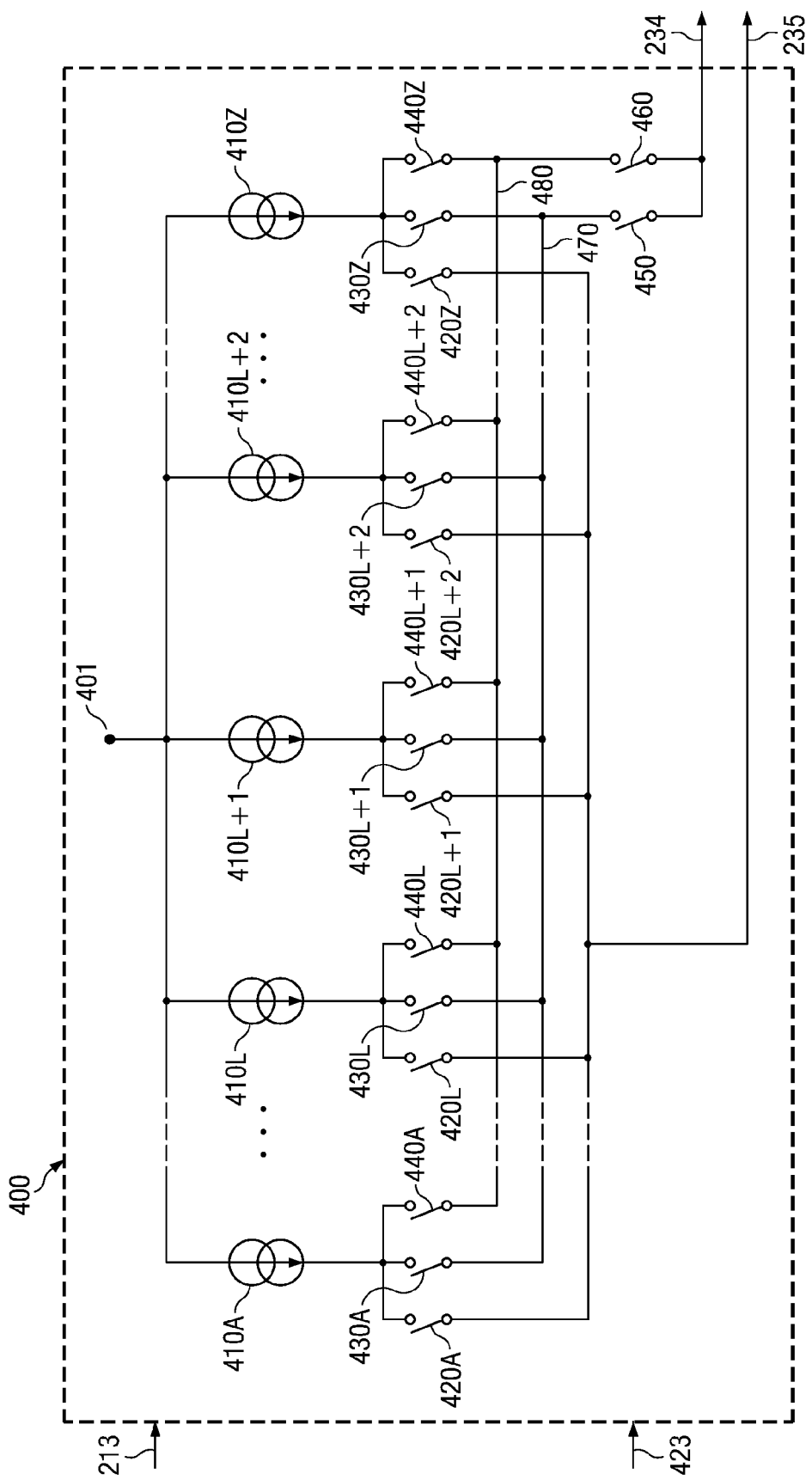
FIG. 4 is a diagram illustrating the internal details of a DAC block in another embodiment of the present invention.

FIG. 4 is a diagram illustrating the internal details of a DAC in another embodiment of the present invention. DAC 400, implemented as a thermometric current DAC, is shown containing constant current sources 410A through 410Z, and switches 420A-420Z, 430A-430Z, 440A-440Z, 450 and 460. Current sources 410A-410Z operate similar to current sources 310A-310Z of FIG. 3, and each assumed to provide a current of "I" amperes.

When DAC 400 is used in place of DAC 230 in the circuit of FIG. 2, logic block 210 is designed to provide (in response to a digital value received on path 201) inputs to SD modulator 220 (on path 212), and to DAC 400 (path 213) in a slightly different manner as compared to when DAC300 (FIG. 3) is used. Outputs 213 and 212 provided by logic block 210 when DAC 400 is used are noted next.

Logic block 210 provides values on path 212 according to the following formulas/conditions (rather than directly providing 0.P, as in the case of the embodiment of FIG. 3):

for values of 0.P ranging from 0 to 0.49999 a value of 1.P is provided; for values of 0.P ranging from 0.5 to 0.99999 a value of 0.P is provided.

Thus, the input to the SD modulator, on path 212, ranges from 0.5 to 1.49999. The reason for the application of the above formula/condition is explained in detail below. However it should be appreciated alternative different formulas can be applied/used under different conditions, as suited in specific environments, as will be apparent to one skilled in the relevant arts by reading the disclosure provided herein.

Further, SD modulator 220 is implemented with a three-level quantizer, and provides a two-bit output quantized stream, as illustrated in greater detail with respect to FIG. 5 below. As the SD modulator operates differently in conjunction with the embodiments of FIGS. 3 and 4, the input from SD modulator is represented as 423 in the Figure.

Correspondingly, logic block 210 provides an integer value on path 213 in thermometric format according to the following formula/condition:

for values of 0.P ranging from 0 to 0.49999 a value of L−1 is provided;

for values of 0.P ranging from 0.5 to 0.99999 a value of L is provided.

The integer value on path 213 in thermometric form controls the closing or opening of switches 420A-420Z ("coarse switches"), thereby either connecting or disconnecting the corresponding current sources to (from) path 235. The number of coarse switches closed is equal to the integer value on path 213. It is noted that according to the formulas noted above, the sum of the values provided on paths 213 and 212 still remains equal to input 201, i.e., L.P.

One bit of each two-bit output of SD modulator 220 controls the opening or closing of switch 450, while the other bit controls the opening or closing of switch 460. For each input digital code (201), logic block 210 closes one of switches 430A-430Z and one of switches 440A-440Z, depending on the specific value of the received input digital code (201). Specifically, if 'coarse switches' 420A-420L are closed, then fine switches 430L+1 and 440L+2 are closed. All other switches remain open. The set of switches 430A-430Z, 440A-440-Z, 450 and 460 may be referred to as "fine switches".

When SD modulator 220 operates in such a way that switches 450 and 460 are rarely ON, the average value of the output on path 234 (and 235) is close to zero. Similarly when the SD modulator operates in such a way that switches 450 and 460 are mostly ON, the average value of the output on path 234 is close to 2*I. The range of outputs obtainable from SD modulator 220 (i.e., on path 234) is, therefore 0 through 2*I, with the resolution within the range [0 to 2*I] determined by the design of SD modulator 220.

As noted above, input 212 to SD modulator 220 ranges from 0.5 to 1.49999 (when DAC 400 is used in place of DAC 230 of FIG. 2). Hence, the required output range of operation on path 234 is (0.5*I) to (1.49999*I). Thus the SD modulator overloading problem is solved, since SD modulator 220 is never operated near the extremes of its output range (i.e., close to 0 or close to 2*I). Accordingly, the description is continued with an example implementation of SD modulator as relevant to the operation of FIG. 4.

5. SD Modulator

FIG. 7 is a block diagram of a sigma delta modulator in an embodiment of the present invention. Although, SD modulator 220 is shown implemented as a second order modulator, SD modulators of higher or lower orders may also be used. Only the details as believed to be pertinent to an understanding of the described embodiments are provided here for conciseness. For an understanding of sigma delta techniques, the reader is referred to "Understanding Delta-Sigma Data Converters" by Richard Schreier and Gabor C. Temes (published by John Wiley and Sons), and "Delta-Sigma Modulators: Modeling, Design and Applications" by George I. Bourdopoulos, Aristodemos Pnevmatikakis, Vassilis Anastassopoulos and Theodore L. Deliyannis (published by Imperial College Press).

SD modulator 220 is shown implemented as a second order modulator, and containing scaling blocks 710, 740, 770, 780 and 790, summing blocks 720 and 750, integrators 730 and 760, and quantizer 795. Scaling blocks 710, 740, 770, 780 and 790 provide respective gain/attenuation G1, G2, G3, G4 and G5 to the respective inputs received. The gain/attenuation values are set taking into consideration various performance parameters, and can be determined in a known way.

Merely for illustration, quantizer 795 and associated circuitry is shown (or described) as implemented with 3 quantization levels. However, it will be apparent to one skilled in the relevant arts how to adapt the features described herein, to a different number of levels, without departing from the scope and spirit of several aspects of the present invention.

Scaled input on path 712 is subtracted (in summing block 720) from the scaled output on path 782, and the difference is integrated by integrator 730. Scaled and integrated output on path 745 is subtracted (in summing block 750) from the scaled output on path 785, and the difference is integrated by integrator 760. The scaled and integrated output on path 779 is quantized (converted to a nearest one of multiple predetermined discrete levels) by quantizer 790. The quantized values are provided on path 223. The output on path 779 varies over a wide range depending on the design of the SD modulator. However output 779 is centered roughly around the value corresponding to SD modulator input 212, i.e., the value of path 779 sweeps a range with values closer to SD modulator input 212 occurring more often than values farther away. Also the output on path 223 could be one of multiple (3 in this example) pre-determined values, however the average value of the output on path 223 corresponds to (represents) the SD modulator input on path 212.

Figures 5, 6:
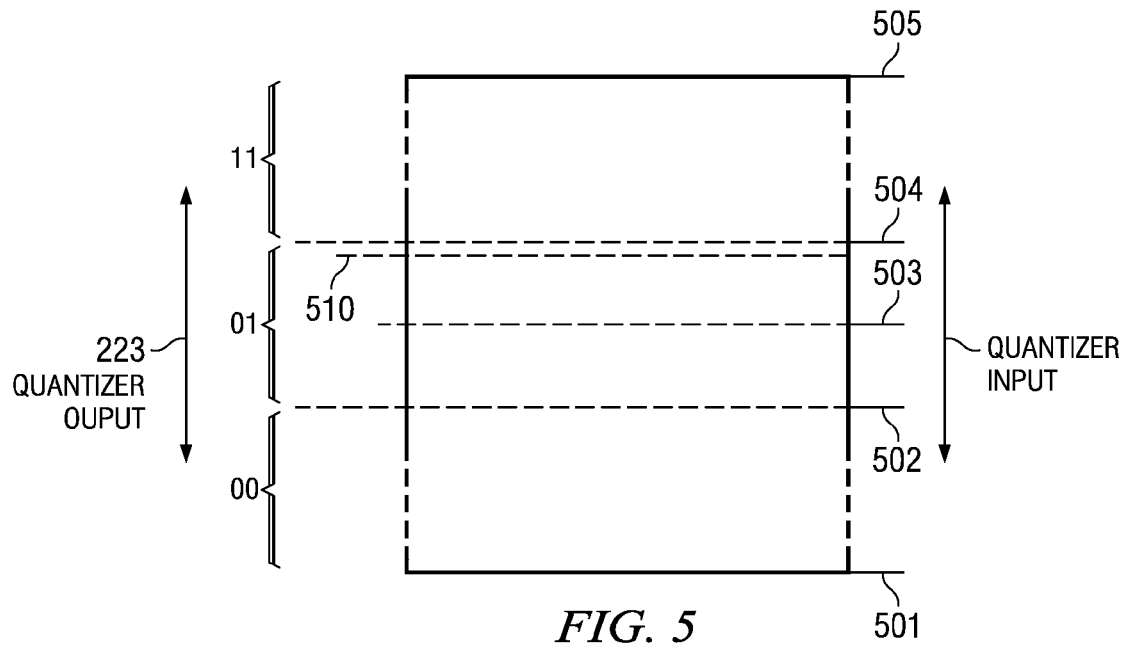
FIG. 5 is a diagram illustrating the input-output relationship of a quantizer used in a sigma delta modulator, in an embodiment of the present invention.
FIG. 6 is a diagram showing example values of various parameters used to illustrate the operation of a sigma delta DAC in an embodiment of the present invention.

FIG. 5 is a diagram illustrating the input-output relationship of quantizer 795 (when DAC 400 is used in place of DAC 230). In the Figure, 502 and 504 are respective lower and upper thresholds used in quantizer 795, thus providing three quantization intervals, denoted in the Figure as 00, 01 and 11. The range of input values between levels 501 to 505 represents the total range of quantizer inputs. Level 503 represents the middle (value of 1) of the total range.

In the Figure, thresholds 502 and 504 correspond to input values (provided to SD modulator 220 on path 212) of 0.5 and +1.5 respectively. Bottom (501) and top (505) of the output range may correspond to input values (on path 212) of 0 and 2 respectively, although lower and higher bottom and top values are also possible. In the embodiment, quantizer 795 provides a value 00 when its input is less than threshold 502, a value 01 when the input is between thresholds 502 and 504, and a value 11 when the input is greater than thresholds 504.

When output 223 of the quantizer is 00, both of switches 450 and 460 are off. When output 223 of the quantizer is 01, switch 450 is on and switch 460 is off. When output 223 of the quantizer is 11, both of switches 450 and 460 are on. The three possible output levels are thus 0, I and 2*I.

The operation of DAC 400 is next illustrated with combined reference to FIGS. 4, 5 and 6. Column 601 in the table of FIG. 6 contains example values of input digital code (201) represented as L.P. Column 602 contains the corresponding entries specifying the number of current sources that are turned on by bits on path 213. Column 603 contains the corresponding input provided to SD modulator 220. The values in columns 602 and 603 are obtained according to the formulas/conditions noted above.

As illustrated by the table of FIG. 6, for values of digital inputs (L.P) between L.0 and (L+0.49999) (both inclusive), (L−1) current sources (for example, 410A through 410L−1) are connected to path 235 via corresponding switches 420A-420L−1. Logic block 210 closes switches (430L) and (440L+1) thereby connecting the $L^{th}$ current source (410L) to path 470, and the $(L+1)^{th}$ current source (410L+1) to path 480.

The corresponding bits of the two-bit output stream on path 423 (output of SD modulator 220) controls the opening and closing of switches 450 and 460 as noted above, to generate an average current value representing the fractional portion 1.P. To illustrate with reference to the table of FIG. 6, when digital code 201 has a value L.49999 (L being an integer, with a value within the permissible input range of sigma delta DAC 200 (FIG. 2), L−1 current sources are connected to path 235 as noted above. The input to SD modulator 220 is 1.49999.

Accordingly, the average value of the quantized stream on output 223 will be close to level 504, with switches 450 and 460 having corresponding on-to-off durations determined by quantized stream 423. Path 234 thus provides a current corresponding to the value 1.49999, with the sum (after filtering in analog filter 240) L.49999*I being provided on path 259.

Rows 611 through 618 show the corresponding values of the input digital code, number of current sources connected to path 235 and the input to SD modulator respectively. For example, when digital code is L+1.0, L current sources are connected to path 235, and input to SD modulator 220 is 1.0. From FIG. 5, the average value of the quantized stream on output 223 will equal level 503. Similarly, when input 201 is L+1.4999, input to SD modulator 220 is 1.4999, corresponding to the average output level 510.

When digital code 201 is L.5, logic block 210 connects L current sources (410A-410L) to path 235, and provides an input of 0.5 to SD modulator 220. Thus coarse output on path 235 is provided by the L current sources, while the fine value of 0.5 is provided on path 234 by on-off operation of the $(L+1)^{th}$ and $(L+2)^{th}$ current sources via switches 450 and 460.

It may be observed from FIGS. 5 and 6 that inputs to SD modulator 220 are so devised that the quantizer never operates close to its uppermost (505) or lowermost (501) range. As a result, the problem of sigma delta overloading noted above is overcome, as desired.

The circuit of FIGS. 4 and 7 can be operated to solve other problems as well. For example, the technique described above with respect to FIGS. 2 and 4 may have a drawback in that mismatches among current sources 410A-410Z themselves may cause non-linearities/discontinuities in the output-input response of sigma delta DAC 200, as illustrated next with respect to FIGS. 8A and 8B. It is noted here that such mismatches in the circuits of FIGS. 3 and 4 may be less than in the prior approach of FIG. 1 (in which the DACs were totally separate), since the current sources (e.g., 410A-410Z) may be placed physically adjacent to one another, and therefore match better because of physical proximity.

The table in FIG. 8A shows the percentage of time (percentage contribution, shown in row 840) that the output of the quantizer in SD modulator 220 equals each of the three levels 0, 1 and 2 (shown in row 830) for an input digital code of value 68.49999. It must be understood that the values in the tables are provided by way of illustration, and that such values may BJT different in other implementations/embodiments. Row 820 shows the corresponding analog output values (259).

It may be noted from the description above that when input digital code (201) has a value 68.49999 (as indicated by row 810), the value provided on path 213 equals 67 (i.e., L−1), and the input to SD modulator 220 is 1.49999 (i.e., 1+0.P). As a result sixty seven current sources (e.g., 1 through 67) are connected to provide the coarse output on path 235, while current sources 68 and 69 are controlled by the output of SD modulator 220 on path 223.

It is noted for clarity that output 223 being constant at level 0 (all output quantized values equal 00, and consequently both of switches 450 and 460 are off) provides an analog output (259) equal to value 67, since the only contribution would be from the 67 current sources connected to the coarse path 235. Output 223 being constant at level 1 (all output quantized values equal 01, and consequently switch 450 being always on, while switch 460 is always off) provides an analog output (259) equal to value 68. Output 223 being constant at level 2 (all output quantized values equal 11, and consequently both of switches 450 and 460 are on) provides an analog output (259) equal to value 69.

For input digital code (201) of value 68.49999, output 223 of SD modulator 220 (or the quantizer within it) toggles among the output levels 0, 1 and 2, with the percentage of the total time output 223 is at the corresponding levels (6%, 38.001% and 55.999%) indicated in row 840 of FIG. 8A. It may be observed that the corresponding contributions [(67×0.06)+(68×0.38001)+(69×0.55999)] provide the average output value of 68.49999, with 67 current sources contributing to the coarse output, as noted above.

The table in FIG. 8B shows the percentage of time (percentage contribution, shown in row 880) that the output of the quantizer in SD modulator 220 equals each of the three levels 0, 1 and 2 (shown in row 870) for an input digital code of value 68.5 (as indicated by row 850). Row 860 shows the corresponding analog output values (259). It may be noted that the transition of the input from 68.49999 to 68.5 has introduced the contribution of a next current source (numbered 70). It may be noted that an input of 68.5, the value provided on path 213 is 68 (i.e., L) and the input to the SD modulator is 0.5 (i.e., 0.P) according to the formulas/conditions noted above and illustrated with respect to FIG. 6.

It may be observed from the tables of FIGS. 8A and 8B that in transitioning from 68.49999 to 68.5, the contribution of each of the current sources has changed substantially. For example, contribution of current source 68 has changed from 38.001% to 56%. While a small change is expected because 68.49999 and 68.5 are different input values, the large change may be due to the specific manner in which SD modulator 220 is implemented.

Assuming that all the current sources are perfectly matched (each provides an exactly same current), the differences in contributions at transition points (when a next current source is introduced to contribute to the output analog value) may not cause a problem. However, mismatches among the current sources could cause a discontinuity in the output at the transition points, resulting in the linearity being degraded.

With respect to FIGS. 8A and 8B, for example, if the 69th current source provides a current 10% higher than that ideal desired current, and the 68th current source provides a current 10% lower than the ideal desired current, the output error would be 0.036 times the value of each current source i.e., (0.1*0.18+0.1*0.18), since the change in the contributions of the current sources is 18% or 0.18). However, the ideal step (if there were no mismatches) when the input changes from 68.49999 to 68.5, should have been 0.00001 times the magnitude of current provided by a (any) current source. Thus, there may be a 3600-fold error in change in the output current for the transition example given above. It is to be noted that the numbers for percentage contribution are from a sample implementation. These numbers will differ from implementation to implementation.

In an embodiment of the present invention, errors such as those noted above, are mitigated by placing the corresponding current sources (e.g., current sources 67 through 70 in the example illustrated with respect to FIGS. 8A and 8B) close to each other when implementing them in silicon (integrated circuit), so that the on-chip gradients (such as spatial and systematic—as opposed to random—variation in physical characteristics of the chip, such as doping concentration, width of the oxide etc.) affect the current sources in a same manner (for example equal positive variations, or equal negative variations).

As described next, an aspect of the present invention, further improves on the solution noted above, to provide a sigma delta DAC whose output is rendered substantially insensitive to such mismatches, thereby providing better linearity.

6. Skewing Quantization Thresholds of the Quantizer

According to an aspect of the present invention, the thresholds used/set within the quantizer used in a SD modulator (such as SD modulator 220) are skewed to render a sigma delta DAC insensitive to component mismatches (e.g., random variations among currents provided by current sources in the embodiments illustrated with respect to FIGS. 3 and 4), thereby further improving the input-output linearity of the sigma delta DAC. It is noted that quantizer thresholds in the SD modulator described above are fixed (that is, independent of input) and symmetric (equidistant from the center of the output range). For example, the quantizer described with respect to FIG. 5 has its thresholds fixed at 0.5 and 1.5, which are spaced 0.5 away from the center of the output range 503 (value of 1).

In an embodiment of the present invention, the quantizer is implemented to have quantization thresholds in the following manner:

For input digital codes (201) ranging from L.0 to L.49999 (corresponding to SD modulator inputs ranging from 1 to 1.49999), the lower threshold of the quantizer is set to 0 (instead of 0.5 as noted with respect to FIG. 5), while the higher threshold is set to 1.5.

For input digital codes ranging from L.5 to L.99999 (corresponding SD modulator inputs ranging from 0.5 to +0.99999), the lower threshold of the quantizer is set to 0.5, and the higher threshold at 2 (instead of 1.5 as noted with respect to FIG. 5).

As noted above, for SD modulator inputs equal to 1.49999, the quantizer inputs are more likely to be closer to 1.49999. It follows that values close to 0.5 will occur more often than values close to zero (0.5 being closer to 1.49999). Thus having the lower threshold at 0, instead of 0.5, reduces the incidence (number of times of occurrence) of the level 0 at the output. SD modulator 220, thus, uses mostly levels 1 and 2 (among the three levels 0, 1 and 2 noted above) when the SD modulator input is close to 1.49999. Similarly, for SD modulator input equal to 0.5, the quantizer inputs are more likely to be closer to 0.5. The values closer to 1.5 will occur more often than the values close to 2. Thus by having the higher threshold at 2 instead of 1.5, the incidence of level 2 at the output is reduced. The SD modulator, thus, uses mostly levels 0 and 1 when the SD modulator input is close to 0.5.

In effect, the threshold settings noted above cause the quantizer to operate substantially like a two-level quantizer for digital inputs close to L.49999 (when SD modulator input is close to 1.49999) and L.5 (where SD modulator input is close to 0.5), and as a three level quantizer for other inputs. SD modulator 220 may be implemented, in a known way, to contain corresponding blocks internally to determine the value of each input, and to set (vary) the thresholds as noted above.

Figures 9A, 9B, 9C:
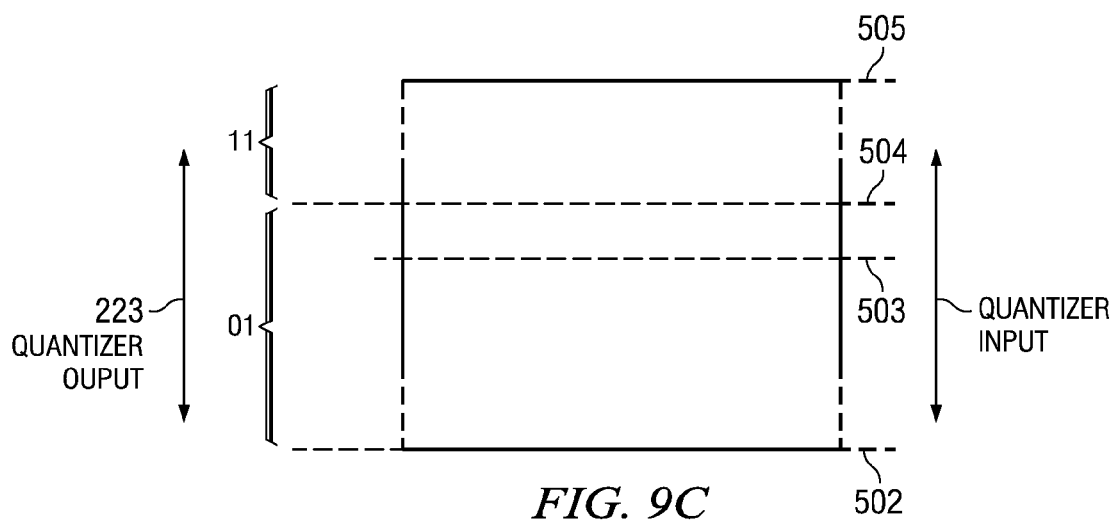
FIGS. 9A and 9B illustrate percentage durations of each possible output levels of a quantizer used in a SD modulator for a specific transition in the input value in an alternative embodiment of the present invention.
FIGS. 9C and 9D illustrate respectively the input-output relationship of a quantizer used in a sigma delta modulator using skewed thresholds, in an alternative embodiment of the present invention

The table in FIG. 9A shows the percentage of time (percentage contribution, shown in row 940) that the output of the quantizer in SD modulator 220 equals each of the three levels 0, 1 and 2 (shown in row 930) for an input digital code of value 68.49999 (shown in row 910), with the skewed-threshold implementation noted above. Row 920 shows the corresponding analog output values (259).

Figures 9D, 10A, 10B:
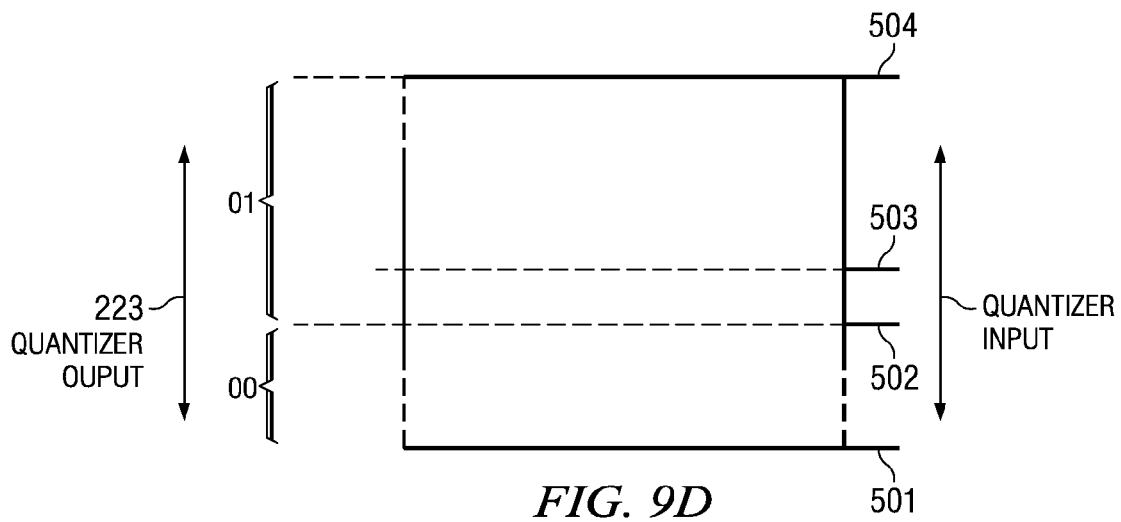
FIGS. 10A and 10B illustrate percentage durations of each possible output levels of a quantizer used in a SD modulator for another specific transition in the input value in an embodiment of the present invention.

The table in FIG. 9B shows the percentage of time (percentage contribution, shown in row 980) that the output of the quantizer in SD modulator 220 equals each of the three levels 0, 1 and 2 (shown in row 970) for an input digital code of value 68.5 (shown in row 950), with the skewed-threshold implementation noted above. Row 960 shows the corresponding analog output values (259). FIGS. 9C and 9D respectively illustrate the skewed thresholds corresponding to the input (201) scenarios of FIGS. 9A and 9B. From a comparison of FIG. 9C and FIG. 5, it may be observed that the lower threshold 502 has been skewed (lowered to 0) from the center (503) of the output range, and almost coinciding with 501 (bottom of output range) of FIG. 5.

Similarly, from a comparison of FIG. 9D and FIG. 5, it may be observed that the upper threshold 504 has been skewed (raised to 2) from the center (503) of the output range, almost coinciding with 505 (top of output range) of FIG. 5. Thus, in an embodiment of the present invention, quantization thresholds of a quantizer used in a sigma delta modulator are asymmetric around the center of the output range of the quantizer.

It may be observed with respect to the tables of FIGS. 9A/9B that the change in the percentage contributions of the current sources 67-70 for input digital code (201) transitioning from 68.49999 to 68.5 is far less than in the corresponding scenario illustrated with respect to FIGS. 8A/8B (no threshold skewing). As a result, the non-linearity error when a next current sources is added to contribute to the output is reduced.

To illustrate with an example, assuming again that the 69th current source provides a current 10% higher than the ideal value, and the 68th 10% lower than the ideal value, the output error would be 0.0011 times the current value provided by a (any) current source (0.1*0.003+0.1*0.008). Since the change in the contributions of the current sources is 0.3% (or 0.003) and 0.8% (or 0.008), the error in the output is reduced. As a comparison, the error in this case is less by close to 33 times compared to the illustrative example of FIGS. 8A/8B, in which error was noted as 0.036.

When input code transitions from L.99999 to L+1.00000, input to SD modulator 220 changes from 0.99999 to 1.00000. At this point the threshold skewing technique described above causes the negative and positive thresholds to change from being 0.5 and 2 respectively, to being 0 and 1.5 respectively. It is noted that such a change in the thresholds does not cause a discontinuity (poorer DNL) for the transition noted above. Due to the symmetric nature of the system, to achieve a value close to SD modulator input of 1 (such as 0.99999 or 1.0000), which lies mid-way between levels 0 and 2, SD modulator 220 has to use the levels 0 and 2 in almost equal measure, and hence there is no discontinuity even though the thresholds are changed at this point.

FIGS. 10A and 10B illustrate percentage contributions of the corresponding current sources for the change (in input digital code) from 67.99999 to 68.00000. It may be observed that the percentage contributions do not change drastically.

While the description was provided with the skewed threshold levels noted above, other threshold values may be used to provide greater or lesser skewing depending on specific requirements of a particular design and/or SD modulator architecture. Further, the quantizer used in SD modulator 220 is noted as being implemented as a 3-level quantizer merely as an example, and may, instead, be also implemented using more than three levels to provide even smoother changes across the transition values noted above. Also, while the embodiments above are described as using current sources (current mode DACs of FIGS. 3 and 4), switched-capacitor DACs or other types of DACs may also be used.

Thus, by skewing the thresholds of the quantizer in the SD modulator, the input-output behavior (representative of linearity) of sigma delta DAC 200 is made substantially insensitive to component mismatch in the DAC used (DAC 300 or DAC 400), thereby providing a sigma delta DAC with good linearity.

It may be understood that while skewing the thresholds as described above provides an easy and elegant implementation, other techniques to achieve similar results are also possible. What is generally required is that for certain input values to the SD modulator, the quantizer operate with fewer output levels than for other inputs. In the examples described above for example, this could be achieved as described next.

As the SD modulator input moves from 1.0 to 1.49999, more and more occurrences of level 2 at the output are digitally replaced by level 1. At SD modulator input equal to 1.15 for example, every fourth occurrence of level 2 may be replaced by level 1, at SD input equal to 1.3 every third occurrence of level 2 is replaced by level 1, and so on, until close to 1.49999 every instance of level 2 is replaced by level 1. Skewing the thresholds achieves the same effect in an easy, gradual manner. Sigma delta DAC 200 implemented as described in the example embodiments above, may be incorporated as part of a device or a system, as described next.

7. Device/System

Figure 11:
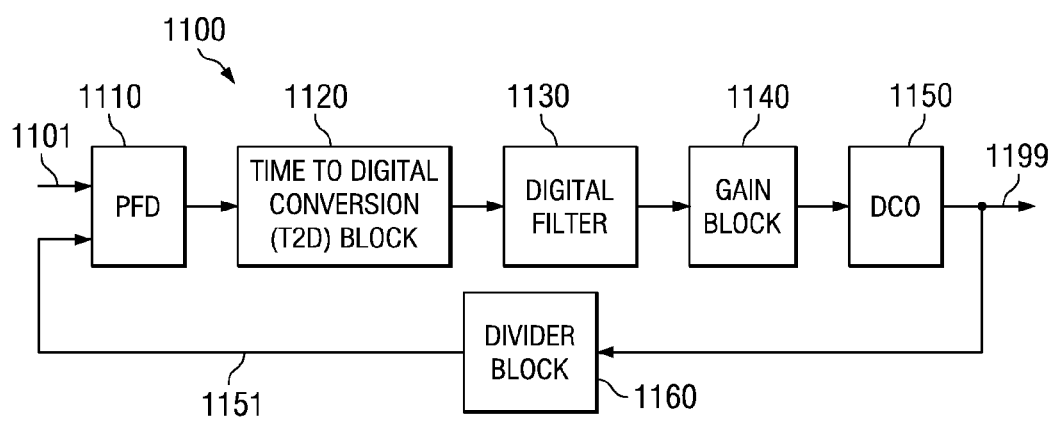
FIG. 11 is a block diagram of a device/system incorporating a sigma delta DAC implemented according to one or more aspects of the present invention.

FIG. 11 is a block diagram of an example device/system incorporating a sigma delta DAC according to one or more aspects of the present invention. The Figure shows a digital phase locked loop (DPLL) system 1100 containing phase/frequency detector (PFD) 1110, time-to-digital conversion block (T2D) 1120, digital filter 1130, gain block 1140, digitally controlled oscillator (DCO) 1150, and divider block 1150. DPLL system 1100 receives a signal (e.g., a clock signal) of frequency fin on path 1101, and provides an output signal fo (1199) with a frequency N*fin synchronized to signal 1101, and where N is a real number.

PFD 1110 receives input signal fin (1101), and output 1151 of divider block 1150, and forwards a value representing the difference in the phase of the two signals 1101 and 1151. T2D block 1120 converts the output of PFD 1110 to corresponding digital values. Digital filter 1130 performs low-pass filtering in the digital domain on the output of T2D block. Gain block 1140 provides a desired gain to the filtered output of digital filter 1130. Gain block 1140 may be optional, and the output of digital filter 1130 may be directly provided to DCO 1150.

DCO 1150 converts the filtered digital values received from gain block 1140 corresponding analog values to generate output signal 1199. Divider block 1150 operates as a frequency divider to divide the frequency of output fo (1199), and provides a signal 1151 with a frequency which is a sub-multiple of fo. The divide-by ratio (1/N) of divider block may be programmable to generate fo with a frequency that is a desired multiple (N*fin) of signal 1101. DCO 1150 may internally contain a controlled oscillator to provide output 1199, with the oscillator being controlled by an analog output of a highly-linear sigma delta DAC implemented as described with respect to the embodiments above, to provide output 1199 with reduced frequency errors and reduced jitter. The frequency of output 1199 varies in relation to the analog output of the sigma delta DAC.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A sigma delta digital to analog converter (DAC) to generate an analog signal having a strength proportionate to a digital value, said digital value having a set of more significant bits (MSBs) and a set of less significant bits (LSBs), said sigma delta DAC comprising:
    a set of DAC elements each to provide a corresponding analog quantity;
    a first set of switches, each operable to couple the corresponding analog quantity to a first path;
    a second set of switches, each operable to couple the corresponding analog quantity to a second path;
    a sigma delta modulator to generate a sequence of quantized values over a duration such that the average of said quantized values represents a first value formed from said set of LSBs, wherein said sequence of quantized values operate said second set of switches to cause a first analog quantity portion proportionate to the value of said LSBs on said second path; and
    a control logic to operate a number of said first set of switches according to a value of said set of MSBs to cause a second analog quantity portion proportionate to the value of said MSBs on said first path,
    wherein a sum of said first analog quantity portion and said second analog quantity portion represents said analog signal corresponding to said digital value,
    wherein there is at least one common DAC element which is operable to be connected to both of said first path and said second path by the corresponding one of said first set of switches and said second set of switches respectively.

2. The sigma delta DAC of claim 1, wherein said corresponding analog quantity is a current, wherein each of said DAC elements is a current source, and said sum is formed at a node by connecting said first path and said second path to said node.

3. The sigma delta DAC of claim 1, further comprising a low pass filter which filters said first portion before being provided to said node.

4. The sigma delta DAC of claim 1, wherein said digital value is representable as L.P, wherein L and P are integers and respectively represent an integer portion and a fractional portion of said digital value, wherein said control logic is designed to:
    if 0.P is in a first range, then using a first formula based on said L and P to determine said MSBs and said LSBs when generating said analog signal for said digital value; and
    if 0.P is in a second range, then using a second formula based on said L and P to determine said MSBs and said LSBs when generating said analog signal for said digital value,
    wherein said first formula is not the same as said second formula.

5. The sigma delta DAC of claim 1, wherein said first value equals a value represented by said LSBs, wherein each of said sequence of quantized values comprise bits, wherein said second set of switches comprise a third switch and a fourth switch, said third switch being operable to couple the corresponding analog quantity to a common path, said fourth switch being operable to be on or off according to said sequence of quantized values, said fourth switch coupling said common path to said second path when on and decoupling said common path from said second path when off.

6. The sigma delta DAC of claim 1, further comprising a low pass filter which filters the sum of said first analog quantity portion and said second analog quantity portion and provides the filtered sum to said node.

7. The sigma delta DAC of claim 1, wherein each of said sequence of quantized values comprises a pair of bits such that said sequence of quantized values represents a first sequence of bits and a second sequence of bits;

wherein said second set of switches comprises a third switch, a fourth switch, a fifth switch and a sixth switch, wherein said third switch being operable to connect a corresponding third DAC element to a first common path and said fourth switch being operable to connect a corresponding fourth DAC element to a second common path, said fifth switch being operable to be switched on and off according to said first sequence of bits and said sixth switch being operable to be switched on and off according to said second sequence of bits, wherein said fifth switch couples said first common path to said second path when on and decoupling when off, and said sixth switch couples said second common path to said second path when on and decoupling when off.

8. The sigma delta DAC of claim 7, wherein said digital value is representable as L.P, wherein L and P are integers and respectively represent an integer portion and a fractional portion of said digital value, wherein said first value formed from said set of LSBs equals (1+0.P) if the value of P in said corresponding number L.P is greater than or equal to 0 and less than 0.5, and equals (0.P) if the value of P in said corresponding number L.P is greater than or equal to 0.5 and less than 1, wherein said control logic provides said value of said set of MSBs in thermometric form as (L−1) if P in said corresponding number L.P is greater than or equal to 0 and less than 0.5, and as L if the value of P in said corresponding number L.P is greater than or equal to 0.5 and less than 1.

9. The sigma delta DAC of claim 1, wherein quantization thresholds in said sigma delta modulator are fixed and equal.

10. The sigma delta DAC of claim 1, wherein said sigma delta modulator is designed to provide said sequence of quantized values which are generated based on quantization thresholds being asymmetric around the center of the output range of the quantizer.

11. The sigma delta DAC of claim 10, wherein said sigma delta modulator alters said quantization thresholds based on said first value according to a formula.

12. The sigma delta DAC of claim 1, further comprising:

an analog filter to filter said first portion and to provide a filtered portion; and a summing block to provide a sum of said filtered portion and said first portion as said analog signal.

13. A sigma delta digital to analog converter (DAC) to generate an analog signal having a strength proportionate to a digital value, said digital value having a set of more significant bits (MSBs) and a set of less significant bits (LSBs), said sigma delta DAC comprising:

a sigma delta modulator to generate a sequence of quantized values over a duration such that the average of said quantized values represents a first value formed from said set of LSBs, wherein said sequence of quantized values operate said second set of switches to cause a first analog quantity portion proportionate to the value of said LSBs on said second path;

a single DAC to receive said sequence of quantized values and a second value formed from said MSBs, and to generate a first analog quantity proportionate to said second value on a first path and a second analog quantity proportionate to a value of said set of LSBs on a second path; and an adder to add said first analog quantity portion and said second analog quantity portion to generate said analog signal corresponding to said digital value.

14. The sigma delta DAC of claim 13, further comprising a control logic to receive said digital value and to determine the specific bits of said digital value forming said MSBs and said LSBs.

15. The sigma delta DAC of claim 14, wherein said single DAC comprises:

a set of DAC elements each to provide a corresponding analog quantity;

a first set of switches, each operable to couple the corresponding analog quantity to said first path; and a second set of switches, each operable to couple the corresponding analog quantity to said second path;

wherein said control logic is designed to operate a number of said first set of switches according to a value of said set of MSBs to cause a second analog quantity portion proportionate to the value of said MSBs on said first path, wherein a sum of said first portion and said second portion represents said analog signal corresponding to said digital value, wherein there is at least one common DAC element which is operable to be connected to both of said first path and said second path by the corresponding one of said first set of switches and said second set of switches respectively.

16. A phase locked loop (PLL) to generate an output signal locked with an input signal, said PLL comprising:

a phase detector to provide a difference signal representing a phase difference between said input signal and a divided signal;

a digital filter to generate a filtered signal by filtering said difference signal; and a digitally controlled oscillator (DCO) to receive said difference signal as a digital value and to generate a corresponding analog signal as said output signal, said digital value having a set of more significant bits (MSBs) and a set of less significant bits (LSBs); and a divider block to divide the frequency of said corresponding analog signal to generate said divided signal, wherein said DCO comprises:

a set of DAC elements each to provide a corresponding analog quantity;

a first set of switches, each operable to couple the corresponding analog quantity to a first path;

a second set of switches, each operable to couple the corresponding analog quantity to a second path;

an oscillator to generate said output signal having a frequency that varies in relation to said analog quantity;

a sigma delta modulator to generate a sequence of quantized values over a duration such that the average of said quantized values represents a first value formed from said set of LSBs, wherein said sequence of quantized values operate said second set of switches to cause a first analog quantity portion proportionate to the value of said LSBs on said second path; and a control logic to operate a number of said first set of switches according to a value of said set of MSBs to cause a second analog quantity portion proportionate to the value of said MSBs on said first path, wherein a sum of said first portion and said second portion represents said analog signal corresponding to said digital value, wherein there is at least one common DAC element which is operable to be connected to both of said first path and said second path by the corresponding one of said first set of switches and said second set of switches respectively.

17. The PLL of claim 16, wherein said corresponding analog quantity is a current, wherein each of said DAC elements is a current source and said sum is formed at a node by connecting said first path and said second path to said node.

18. The PLL of claim 16, wherein said digital value is representable as L.P, wherein L and P are integers and respectively represent an integer portion and a fractional portion of said digital value, wherein said control logic is designed to:

if 0.P is in a first range, then using a first formula based on said L and P to determine said MSBs and said LSBs when generating said analog signal for said digital value; and if 0.P is in a second range, then using a second formula based on said L and P to determine said MSBs and said LSBs when generating said analog signal for said digital value, wherein said first formula is not the same as said second formula.

19. The PLL of claim 16, wherein said first value equals a value represented by said LSBs, wherein each of said sequence of quantized values is a bit, wherein said second set of switches comprise a third switch and a fourth switch, said third switch being operable to couple the corresponding analog quantity to a common path, said fourth switch being operable to be on or off according to said sequence of bits, said fourth switch coupling said common path to said second path when on and decoupling said common path from said second path when off.

20. The PLL of claim 16, wherein said first value equals a value representing (1−P), wherein P represents a fraction of the value of said LSBs over the bit position value of the least significant bit of the MSBs, wherein each of said sequence of quantized values comprises a pair of bits such that said sequence of quantized values represents a first sequence of bits and a second sequence of bits;

wherein said second set of switches comprises a third switch, a fourth switch, a fifth switch and a sixth switch, wherein said third switch being operable to connect a corresponding third DAC element to a first common path and said fourth switch being operable to connect a corresponding fourth DAC element to a second common path, said fifth switch being operable to be switched on and off according to said first sequence of bits and said sixth switch being operable to be switched on and off according to said second sequence of bits, wherein said fifth switch couples said first common path to said second path when on and decoupling when off, and said sixth switch couples said second common path to said second path when on and decoupling when off.

* * * * *